(12) United States Patent
Sasaki

(10) Patent No.: US 9,935,061 B2
(45) Date of Patent: Apr. 3, 2018

(54) RESIN INTERPOSER, SEMICONDUCTOR DEVICE USING RESIN INTERPOSER, AND METHOD OF PRODUCING RESIN INTERPOSER

(71) Applicant: FUJITSU LIMITED, Kawasaki-shi, Kanagawa (JP)

(72) Inventor: Shinya Sasaki, Ebina (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/618,939

(22) Filed: Jun. 9, 2017

(65) Prior Publication Data

US 2017/0373020 A1 Dec. 28, 2017

(30) Foreign Application Priority Data

Jun. 22, 2016 (JP) .................................. 2016-123689

(51) Int. Cl.
| | |
|---|---|
| *H01L 23/495* | (2006.01) |
| *H01L 23/00* | (2006.01) |
| *H01L 23/498* | (2006.01) |
| *H01L 21/48* | (2006.01) |

(52) U.S. Cl.
CPC .......... *H01L 23/562* (2013.01); *H01L 21/486* (2013.01); *H01L 21/4857* (2013.01); *H01L 23/49822* (2013.01); *H01L 23/49827* (2013.01); *H01L 23/49838* (2013.01); *H01L 23/49894* (2013.01); *H01L 24/16* (2013.01); *H01L 2224/16227* (2013.01); *H01L 2924/3511* (2013.01)

(58) Field of Classification Search
CPC . H01L 21/4857; H01L 21/486; H01L 23/562; H01L 23/49822; H01L 23/49827; H01L 23/49838; H01L 23/49894; H01L 24/16; H01L 27/14634; H01L 27/14658; H01L 27/14636; H01L 27/14659
USPC .................................. 257/659, 668; 438/107
See application file for complete search history.

(56) References Cited

U.S. PATENT DOCUMENTS

| | | | |
|---|---|---|---|
| 2001/0002733 A1 | 6/2001 | Bessho et al. | |
| 2012/0286404 A1* | 11/2012 | Pagaila | ................. H01L 21/561 257/659 |
| 2014/0150258 A1* | 6/2014 | Shimizu | ............ H01L 23/49822 29/852 |

FOREIGN PATENT DOCUMENTS

| | | |
|---|---|---|
| JP | 2004-134817 | 4/2004 |
| JP | 2006-156432 | 6/2006 |

\* cited by examiner

*Primary Examiner* — Brook Kebede
(74) *Attorney, Agent, or Firm* — Fujitsu Patent Center

(57) ABSTRACT

A resin interposer having a semiconductor chip mounted thereon to couple the semiconductor chip to a printed circuit board, the resin interposer includes a wiring layer having a front surface to which the semiconductor chip is coupled and formed by alternately laminating an insulating resin and a metal wiring, and a pressure-sensitive adhesive layer formed on a rear surface of the wiring layer and having a through via formed therein to couple the wiring layer and the printed circuit board to each other.

3 Claims, 8 Drawing Sheets

RESIN INTERPOSER, SEMICONDUCTOR DEVICE USING RESIN INTERPOSER, AND METHOD OF PRODUCING RESIN INTERPOSER

CROSS-REFERENCE TO RELATED APPLICATION

This application is based upon and claims the benefit of priority of the prior Japanese Patent Application No. 2016-123689, filed on Jun. 22, 2016, the entire contents of which are incorporated herein by reference.

FIELD

The embodiments discussed herein are related to a resin interposer, a semiconductor device using the resin interposer, and a method of producing the resin interposer.

BACKGROUND

With the increase of the processing speed and the integration density of a semiconductor chip, in a server equipped with semiconductor chips, the semiconductor chips are connected to each other by micro wiring, and the transmission speed of a signal is increased between the semiconductor chips. Further, a three-dimensional mounting has been developed which implements the high speed transmission of a signal by forming through vias (through silicon vias (hereinafter, referred to as "TSVs")) in semiconductor chips and laminating and connecting the semiconductor chips to each other by micro bumps. However, when TSVs is formed in a semiconductor chip, the semiconductor chip itself becomes expensive. Thus, the use of the three-dimensional mounting is limited to, for example, a memory.

In addition, a 2.5-dimensional mounting has been developed in which a silicon interposer is disposed as an intermediate board between a semiconductor chip and a printed circuit board so as to transmit a signal at a high speed through the silicon interposer. While the 2.5-dimensional mounting is also excellent in the high speed transmission of a signal, this mounting also requires the formation of TSVs in the silicon interposer thereby causing the high cost. Hence, using a resin interposer employing a resin for the purpose of reducing the cost has been reviewed.

However, since the resin interposer is entirely formed of a resin layer even including a wiring layer, the warpage of the resin interposer may increase. Hence, when the resin interposer having the large warpage is mounted on a printed circuit board, there is a problem in that the resin interposer and some bumps of the printed circuit board are not bonded to each other due to the influence of the warpage.

The followings are reference documents.
[Document 1] Japanese Laid-Open Patent Publication No. 2004-134817 and
[Document 2] Japanese Laid-Open Patent Publication No. 2006-156432.

SUMMARY

According to an aspect of the invention, a resin interposer having a semiconductor chip mounted thereon to couple the semiconductor chip to a printed circuit board, the resin interposer includes: a wiring layer having a front surface to which the semiconductor chip is coupled and formed by alternately laminating an insulating resin and a metal wiring; and a pressure-sensitive adhesive layer formed on a rear surface of the wiring layer and having a through via formed therein to couple the wiring layer and the printed circuit board to each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
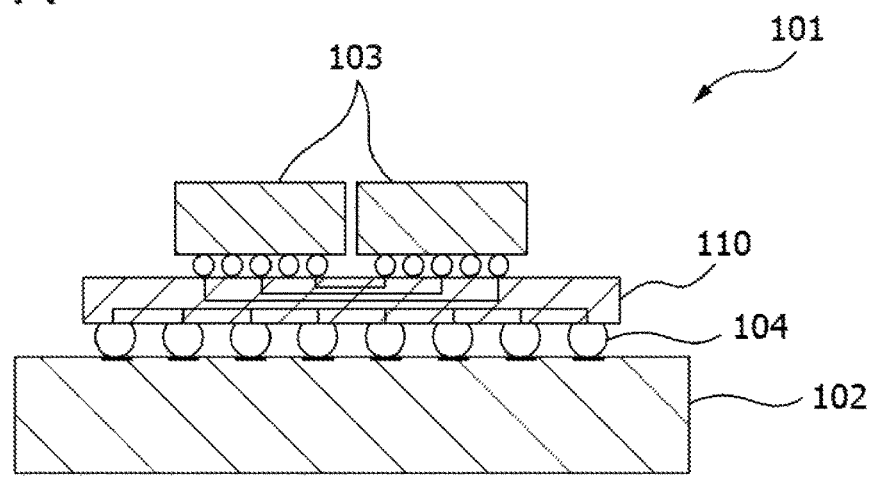
FIG. 1A is a sectional view illustrating a semiconductor device using a resin interposer of a related art.

Hereinafter, embodiments of the present disclosure will be described in detail based on specific examples using the accompanying drawings. Identical or similar components in the embodiments will be denoted common reference numerals. The scales of the drawings are appropriately changed for easy understanding.

Figure 1B:
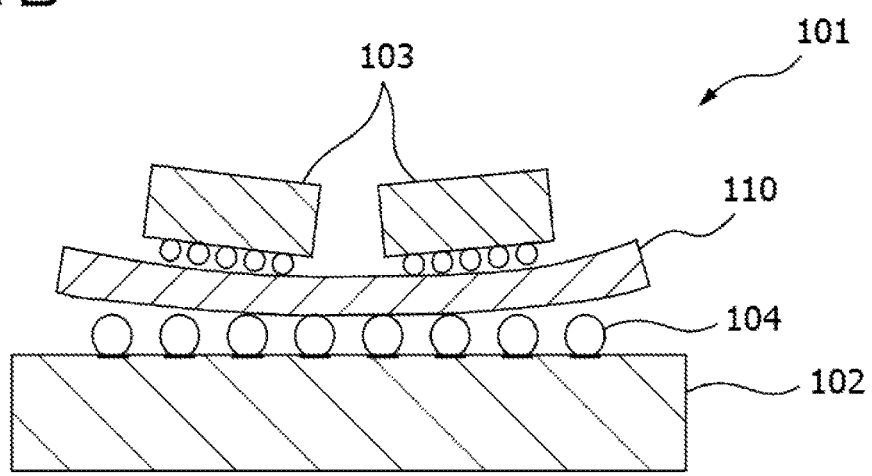
FIG. 1B is a view illustrating a state where the resin interposer is warped.

FIG. 1A illustrates a semiconductor device 101 using a resin interposer 110 of a related art. Since the resin interposer 110 of the related art is entirely formed of a resin layer including even a wiring layer, the warpage of the resin interposer 110 increases after the formation of the resin interposer 110 as illustrated in FIG. 1B. When the resin interposer 110 having the large warpage is mounted on a printed circuit board 102, there is a problem in that some of bumps 104 are not bonded to the printed circuit board 102 due to the influence of the warpage. In this regard, by uniformly applying a pressure to the resin interposer 110 with a tool for picking up the resin interposer 110 at the time of a flip-chip mounting, the resin interposer 110 may be temporarily fixed in a state where the warpage is reduced. However, there is a problem in that since a reflow soldering may not be performed in the state of applying the pressure, some of the bumps 104 are not bonded at the time of the reflow soldering so that the resin interposer 110 is detached.

In addition, even when the resin interposer 110 may be electrically bonded to the printed circuit board 102, it is difficult to mount a semiconductor chip 103 on the rein interposer 110 in the state where the surface of the resin interposer 110 is warped. This is because the size of a bump at the printed circuit board 102 side is about 90 μm whereas the size of a bump at the semiconductor chip 103 side is as small as about 25 μm, and therefore, the semiconductor chip 103 is hardly connected to the wiring layer corresponding to the warpage of the resin interposer 110.

Figure 2:
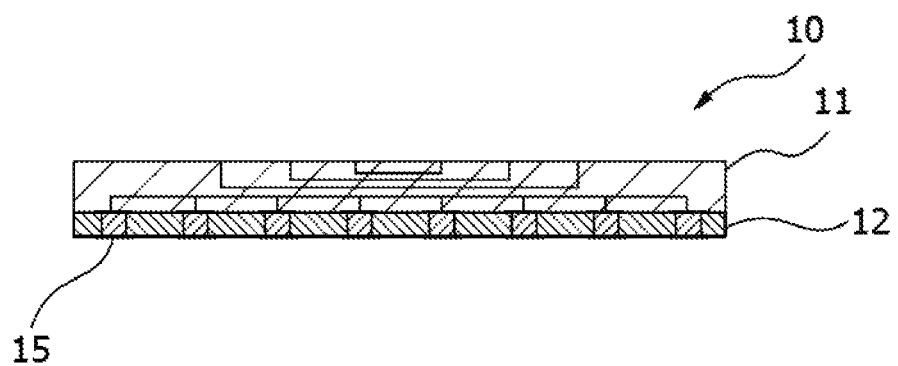
FIG. 2 is a sectional view illustrating a resin interposer of the present disclosure.
Figure 3A:
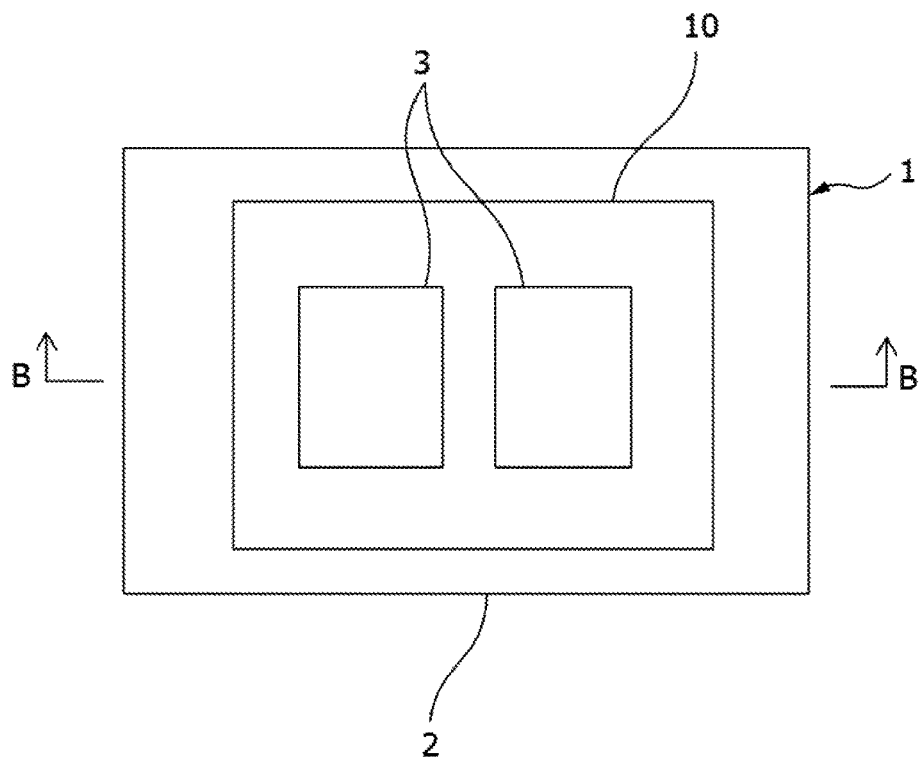
FIG. 3A is a plan view illustrating a semiconductor device using the resin interposer of the present disclosure.
Figure 3B:
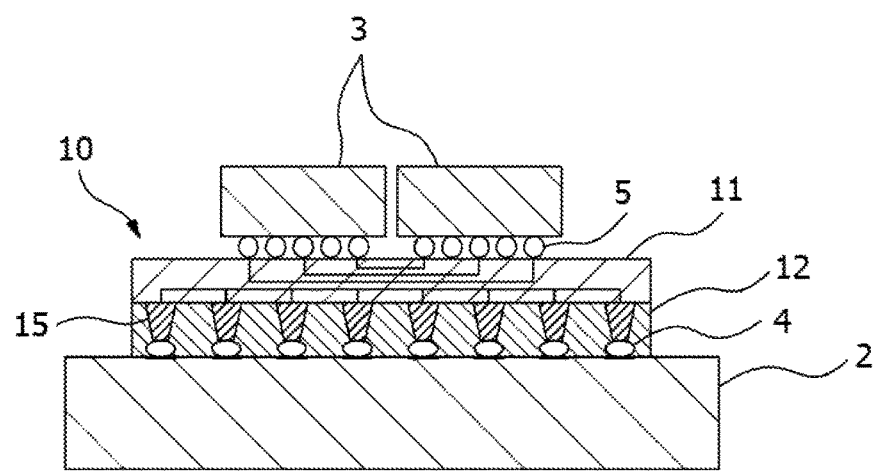
FIG. 3B is a sectional view taken along the line B-B of FIG. 3A.

FIG. 2 is a sectional view illustrating a resin interposer 10 according to the present disclosure. FIG. 3A is a plan view illustrating a semiconductor device 1 using the resin interposer 10, and FIG. 3B is a sectional view taken along line B-B of FIG. 3A. As illustrated in FIGS. 3A and 3B, the resin interposer 10 is a resin interposer 10 configured to mount semiconductor chips 3 thereon and connect the semiconductor chips 3 to a printed circuit board 2. The resin interposer 10 includes a resin wiring layer 11 that is connected to the semiconductor chips 3 and a pressure-sensitive adhesive layer 12 that is formed at the printed circuit board 2 side of the wiring layer 11. A plurality of TSVs 15 is formed in the adhesive layer 12 to connect the wiring layer 11 to the printed circuit board 2.

As illustrated in FIGS. 3A and 3B, the semiconductor device 1 using the resin interposer 10 of the present embodiment includes the semiconductor chip 3 (e.g., a central processing unit (CPU) or a memory), the resin interposer 10, and the printed circuit board 2. The wiring layer 11 of the resin interposer 10 is connected to the semiconductor chips 3 by micro bumps 5. The adhesive layer 12 is bonded to the printed circuit board 2. The plurality of TSVs 15 of the adhesive layer 12 is formed to connect the wiring layer 11 to the printed circuit board 2 via the bumps 4. Since the resin interposer 10 is bonded to the printed circuit board 2 by the adhesive layer 12, the resin interposer 10 is hard to be peeled off from the printed circuit board 2 so that the warpage of the resin interposer 10 is suppressed and the flatness is improved.

As the adhesive layer 12 of the resin interposer 10, a silicon- or urethane-based material having a high heat resistance may be used. In addition, as a metal embedded in the TSVs 15, at least one metal or alloy selected from copper, a copper alloy, silver, tin, and gold may be used from the viewpoint of the connection resistance. The adhesive layer 12 may be formed of a silicon- or urethane-based single material having the high heat resistance, but may be formed by applying an adhesive or the like to a base material. In the case of using a base material for the adhesive layer 12, a base material having the excellent heat resistance such as polyimide, polyphenylene sulfide (PPS), polyester (PS), or Teflon (registered trademark) may be used. As a result of using the base material for producing the adhesive layer 12, the strength increases thereby facilitating the formation of the TSVs 15.

As illustrated in FIGS. 3A and 3B, the adhesive layer 12 side of the resin interposer 10 is mounted on the printed circuit board 2, and the TSVs 15 and pads (not illustrated) provided on the printed circuit board side wiring layer are bonded to each other by the bumps 4. In addition, the semiconductor chips 3 are mounted on the resin interposer 10 using the micro bumps 5 so as to complete the semiconductor device 1.

As the semiconductor chips 3, not only a device using silicon but also a device using gallium nitride (GaN), gallium arsenide (GaAs), or silicon carbide (SiC) may be used. In addition, a post (not illustrated) may be formed on the surfaces of the semiconductor chips 3 to be bonded to the resin interposer 10. The post may be formed of at least one kind of metal selected from copper, a copper alloy, silver, tin, and gold. The post may be formed of one kind of metal or may be formed using an alloy. In addition, an underfill may be used between the resin interposer 10 and the mounting surface of the printed circuit board 2.

The resin interposer 10 and the semiconductor chip 3 may be mounted using a semiconductor manufacturing apparatus such as, for example, a flip chip bonder or a mounter.

Figure 4A:
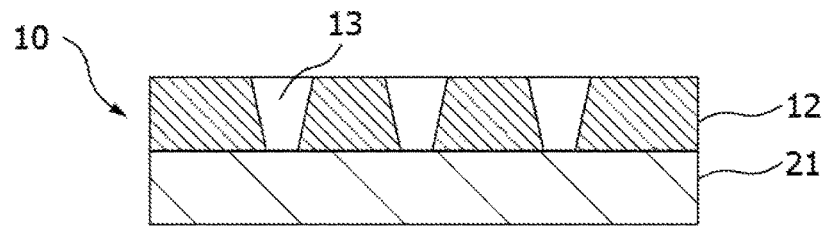
FIGS. 4A to 4D are sectional views illustrating a method of producing the resin interposer.
Figure 4B:
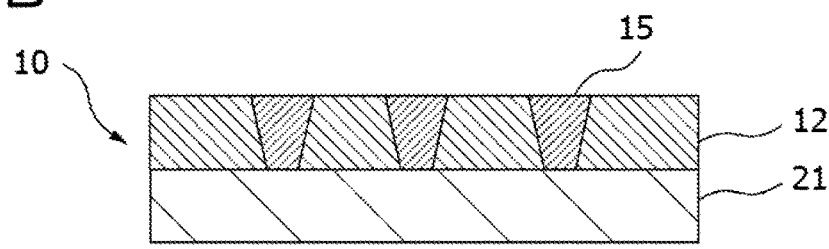
Figure 4C:
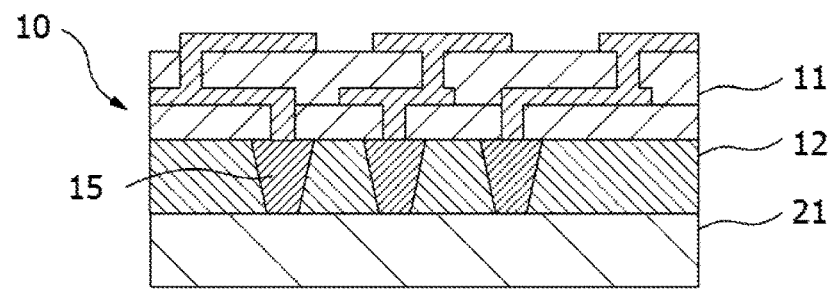
Figure 4D:
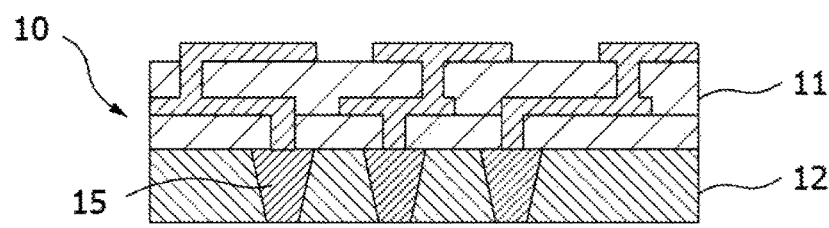
Figure 4D:

A method of producing the resin interposer 10 will be described with reference to FIGS. 4A to 4D. For the resin interposer 10, as illustrated in FIG. 4A, an adhesive layer 12 is formed on a separable support 21, and one or more through holes 13 are formed in the adhesive layer 12. Subsequently, as illustrated in FIG. 4B, a conductor is embedded in the one or more through holes 13 to form the TSVs 15. Subsequently, as illustrated in FIG. 4C, a wiring layer 11 is formed on the adhesive layer 12. Then, as illustrated in FIG. 4D, the adhesive layer 12 is separated from the support 21 so as to complete a resin interposer 10.

As the support 21, any material may be used as long as the material has the flatness, and, for example, silicon (Si), glass, a stainless steel (SUS) material, or an aluminum (Al) plate may be used. As the adhesive layer 12, for example, a silicon- or urethane-based material having the heat resistance may be used. The adhesive layer 12 may be formed by laminating a film-shaped adhesive on a base material or by applying a liquid adhesive to a base material.

As the method of forming the through holes 13 on the adhesive layer 12 as illustrated in FIG. 4A, a method using a laser may be used. When a laser is used to form the through holes 13, for example, a carbon dioxide gas laser, a UV-YAG laser, or an excimer laser may be used.

In addition, as the method of forming the through holes 13 on the adhesive layer 12, a dry etching may be used. When the through holes 13 are formed by the dry etching, a portion other than the portion where the through holes 13 are to be formed is first protected by a resist. Then, after the through holes 13 are formed by the dry etching using a gas such as oxygen or carbon tetrafluoride, the resist is separated. In this way, the through holes 13 are formed at predetermined positions.

As the method of forming the TSVs 15, a method of printing a metal paste exists. In addition, the TSVs may be formed using electroplating after forming a seed layer.

Figure 5A:
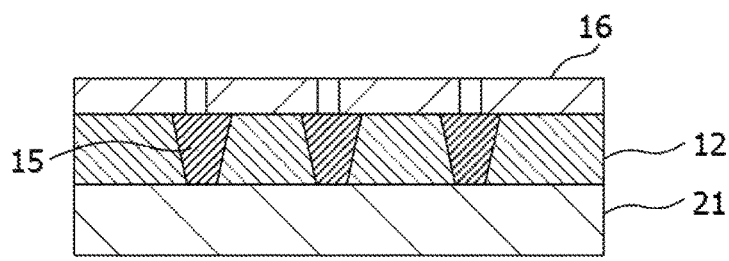
FIGS. 5A to 5D are sectional views illustrating a method of producing a wiring layer of the resin interposer.
Figure 5B:
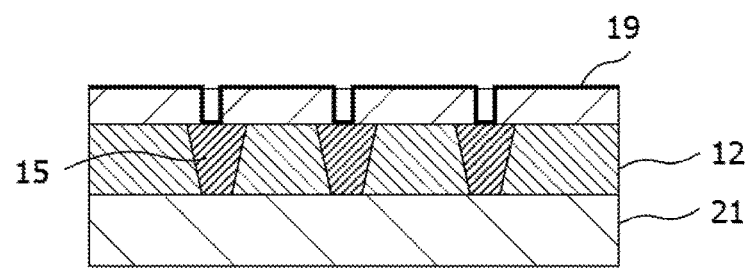
Figure 5C:
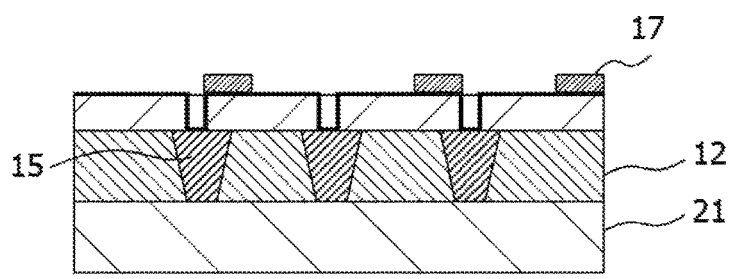
Figure 5D:
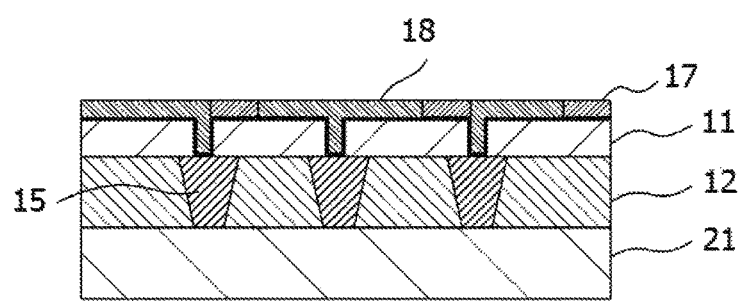

FIGS. 5A to 5D illustrate a sequence of producing the wiring layer 11. The wiring layer 11 may be formed by alternately laminating an insulating resin 16 and a metal wiring 18. As illustrated in FIG. 5A, the insulating resin 16 is laminated on the adhesive layer 12 formed with the TSVs 15 and exposed and developed to form a pattern. As illustrated in FIG. 5B, for example, a seed layer 19 (Ti/Cu) is formed on the insulating resin 16 by sputtering. As illustrated in FIG. 5C, a patterning is performed with a resist 17. As illustrated in FIG. 5D, after a metal wiring 18 is plated and formed, the resist 17 is separated. Thereafter, the resin interposer 10 is separated from the support 21.

As the insulating resin 16, for example, an epoxy resin, a phenol resin, a polyimide resin, benzocyclobutene (BCB), or polybenzoxazole (PBO) may be used. For the metal wiring 18, for example, copper, a copper alloy, silver, gold, or aluminum may be used.

Figure 6A:
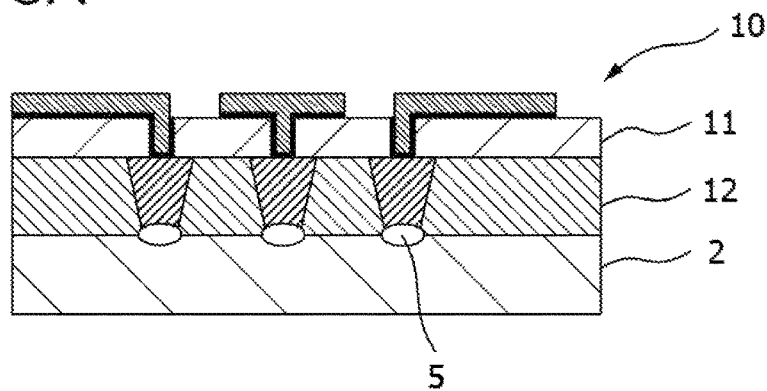
FIGS. 6A to 6C are sectional views illustrating a sequence of mounting a semiconductor chip on the resin interposer.
Figure 6B:
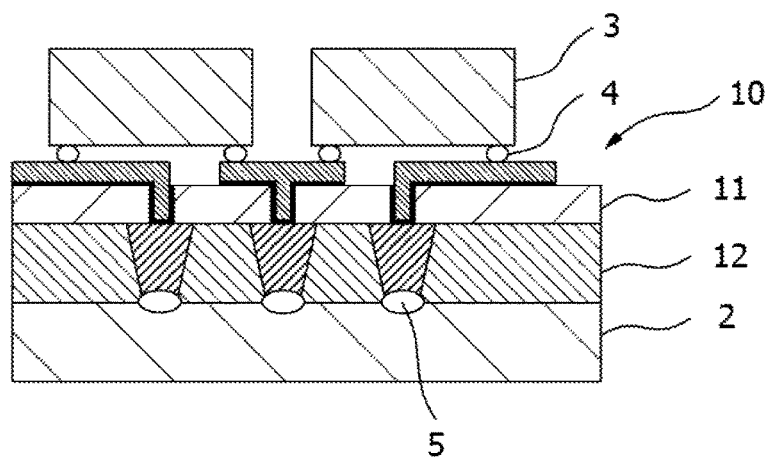
Figure 6C:
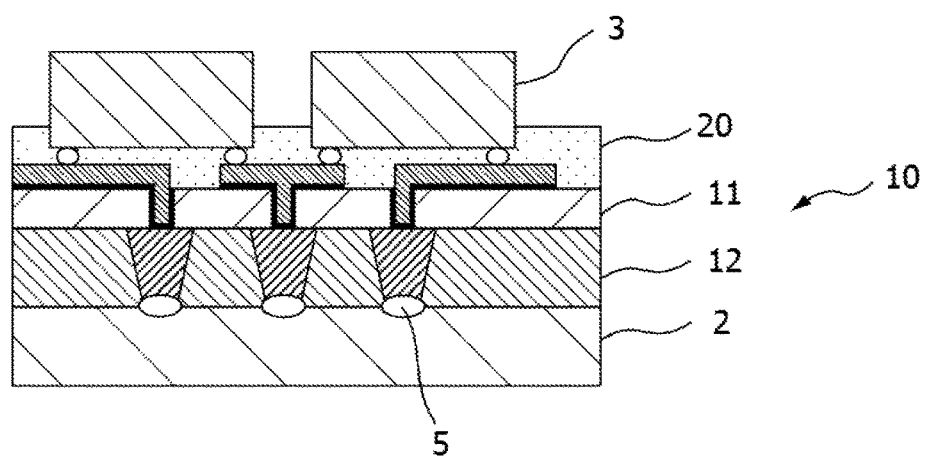

After the resin interposer 10 is produced, as illustrated in FIG. 6A, the resin interposer 10 is mounted on the printed circuit board 2 by using a semiconductor manufacturing apparatus such as a flip chip bonder, and a reflow soldering is performed. Subsequently, as illustrated in FIG. 6B, semiconductor chips 3 are mounted thereon. Then, as illustrated in FIG. 6C, an underfill 20 is poured between the semiconductor chips 3 and the resin interposer 10 and cured at a predetermined temperature so as to complete the semiconductor device 1.

Hereinafter, Examples 1 to 3 for the method of producing the resin interposer according to the present embodiment will be described.

EXAMPLE 1

As illustrated in FIG. 4A, the 20 μm silicon-based adhesive layer 12 was formed on a silicon wafer (the support 21), and the through holes 13 each having φ60 μm were processed by a carbon dioxide gas laser. Then, as illustrated in FIG. 4B, a solder paste (Senju Metal Industry Co., Ltd.; Model No. M 705) of a lead-free solder was printed.

As illustrated in FIG. 5A, a photosensitive phenolic resin was applied by a spin coating, and prebaked, exposed, developed, and cured so as to form an insulating layer having a film thickness of 10 μm. Subsequently, as illustrated in FIG. 5B, titanium and copper films were formed with a thickness of 0.1 μm and a thickness of 0.3 μm, respectively, by sputtering so as to form the seed layer 19. Thereafter, as illustrated in FIG. 5C, a photoresist pattern having openings at the TSVs 15 and a part of a wiring layer 11 was formed, and as illustrated in FIG. 5D, electroplating of copper was performed by using the previously formed seed layer 19. After the electroplating, the photoresist was separated, and the seed layer 19 remaining under the photoresist was removed by a wet etching and a dry etching so as to form a rewiring of L/S=20/20 μm.

Further, as illustrated in FIG. 4D, the silicon wafer (the support 21) and the adhesive layer 21 are separated from each other so as to form a resin interposer 10.

As illustrated in FIG. 6A, the resin interposer 10 having the adhesive layer 12 was aligned and mounted on the printed circuit board 2 such that the adhesive layer 12 was positioned on the copper pad side of the printed circuit board 2, and was bonded thereto by a reflow soldering.

As illustrated in FIG. 6B, the semiconductor chips 3 in which a 10 μm SnAg (tin silver) solder is formed on a copper post having a diameter of 50 μm and a height of 40 μm were mounted on the resin interposer 10, and then, the solder portion was bonded by the reflow soldering. Then, as illustrated in FIG. 6C, the underfill 20 was poured and cured at 165° C. so as to complete the semiconductor device 1.

EXAMPLE 2

Figure 7A:
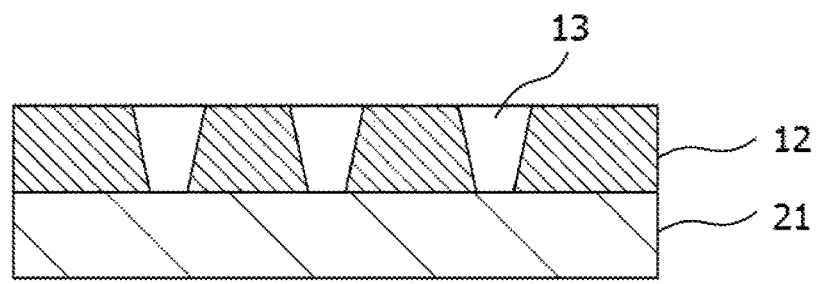
FIGS. 7A to 7C are sectional views illustrating another example of a method of forming a through via.
Figure 7B:
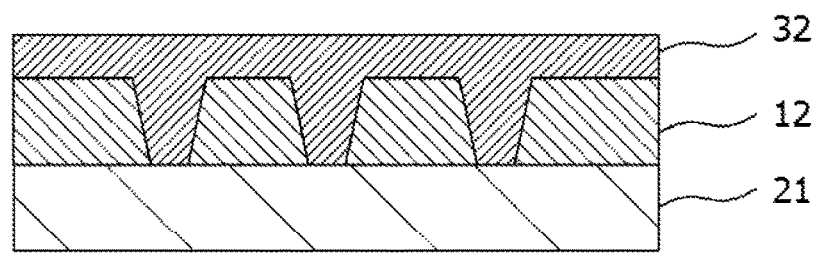
Figure 7C:
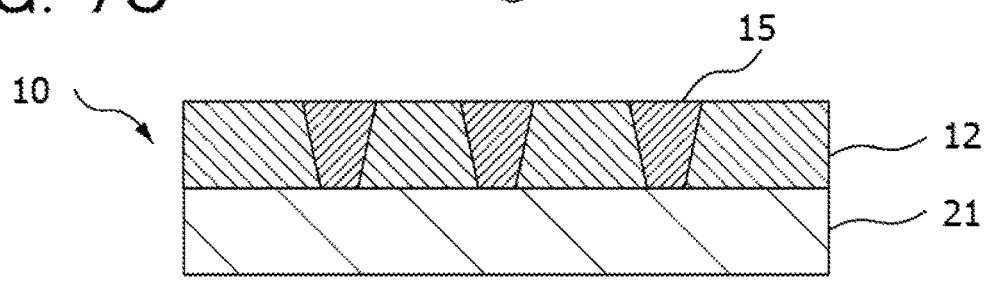

In Example 2, the TSVs 15 are formed by a method illustrated in FIGS. 7A to 7C. First, a 20 μm silicone-based adhesive layer 12 was formed on a silicon wafer (the support 21). As illustrated in FIG. 7A, through holes 13 each having a diameter of 60 μm were processed by the carbon dioxide gas laser. Thereafter, as illustrated in FIG. 7B, the through holes 13 were filled with a copper plating 32. As illustrated in FIG. 7C, the copper of the portions other than the through holes 13 was removed by performing an etching so as to form the TSVs 15. Further, titanium was removed by an etching so as to form the same resin interposer as the resin interposer 10 illustrated in FIG. 4B. Since the subsequent processes are similar to those of the producing method of Example 1 which are subsequent to FIG. 4C, descriptions thereof will be omitted.

EXAMPLE 3

Figure 8A:
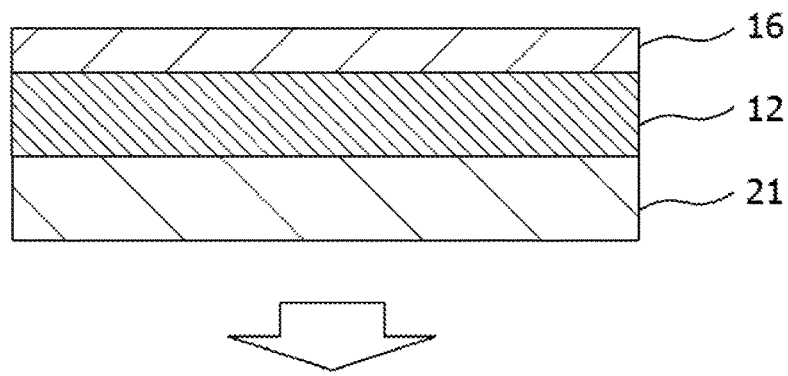
FIGS. 8A and 8B are sectional views illustrating still another example of a method of forming TSVs.
Figure 8B:
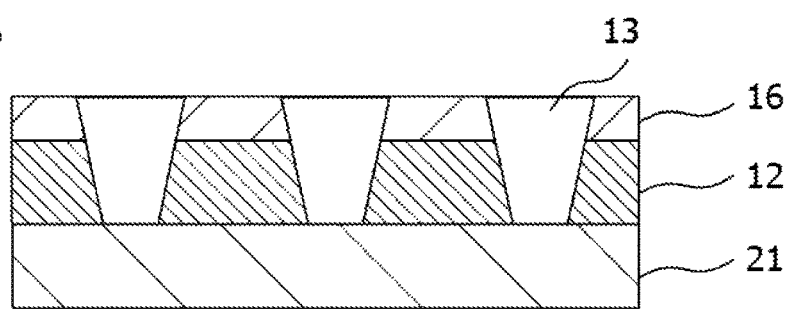

In Example 3, as illustrated in FIGS. 8A and 8B, an adhesive layer 12 and a layer (an insulating layer) on the adhesive layer 12 were formed prior to the formation of the through holes 13. Specifically, a 20 μm silicon-based adhesive layer 12 and a 25 μm polyimide film (the insulating resin 16) were formed on a silicon wafer (the support 21). After the through holes 13 each having a diameter of 60 μm were processed by the carbon dioxide gas laser, a solder paste (Senju Metal Industry Co., Ltd.; Model No. M 705) of a lead-free solder was printed. Since the subsequent processes are similar to those in Examples 1 and 2, descriptions thereof will be omitted.

According to the resin interposer 10 of the present disclosure, the bonding of the TSVs 15 to the printed circuit board 5 and the fixing of the resin interposer 10 by the adhesive layer 12 may be performed by applying a pressure at the time of mounting the resin interposer. Therefore, even when the warpage of the resin interposer 10 occurs, the resin interposer 10 is suppressed from being detached at the time of the reflow soldering due to the influence of the warpage.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A resin interposer having a semiconductor chip mounted thereon to couple the semiconductor chip to a printed circuit board, the resin interposer comprising:
    a wiring layer having a front surface to which the semiconductor chip is coupled and formed by alternately laminating an insulating resin and a metal wiring; and
    a pressure-sensitive adhesive layer formed on a rear surface of the wiring layer and having a through via formed therein to couple the wiring layer and the printed circuit board to each other.

2. A semiconductor device comprising:
    a semiconductor chip;
    a printed circuit board; and
    a resin interposer including a resin wiring layer on which the semiconductor chip is mounted thereon to be coupled to the semiconductor chip and a pressure-sensitive adhesive layer having a through via formed therein to couple the wiring layer to the printed circuit board.

3. A method of producing a resin interposer, comprising:
    forming a pressure-sensitive adhesive layer on a support substrate and forming a through hole in the pressure-sensitive adhesive layer;
    forming a through via by filling the through hole with a conductor;
    forming a resin wiring layer to be coupled to the through via, on the adhesive layer; and
    separating the adhesive layer from the support substrate.

* * * * *